United States Patent [19]
Guez

[11] Patent Number: 5,832,412
[45] Date of Patent: Nov. 3, 1998

[54] PROGRAMMABLE DIGITAL FREQUENCY ULTRASONIC GENERATOR

[75] Inventor: Avner Guez, Dresher, Pa.

[73] Assignee: Kulicke and Soffa Investments, Inc., Wilmington, Del.

[21] Appl. No.: 598,985

[22] Filed: Feb. 9, 1996

[51] Int. Cl.[6] .................................................. G01H 13/00
[52] U.S. Cl. ............................ 702/75; 702/39; 310/316; 310/322; 73/648
[58] Field of Search .................................. 364/484, 483, 364/481, 148, 477.06, 505–508; 310/316–318, 321–323, 328; 318/116, 118; 331/4, 154, 155, 65, 158, 177 R, 116 R; 156/73.1–73.3, 580.1; 228/110.1, 1.1, 102, 8, 4.5, 9; 73/579, 645–648

[56] References Cited

U.S. PATENT DOCUMENTS

| | | | |
|---|---|---|---|
| 4,696,425 | 9/1987 | Landes | 228/1.1 |
| 4,808,948 | 2/1989 | Patel et al. | 331/4 |
| 4,815,001 | 3/1989 | Uthe et al. | 364/477.06 |
| 4,824,005 | 4/1989 | Smith, Jr. | 228/1.1 |
| 5,044,543 | 9/1991 | Yamazahi et al. | 228/1.1 |
| 5,216,338 | 6/1993 | Wilson | 318/116 |
| 5,357,423 | 10/1994 | Weaver et al. | 364/148 |
| 5,578,888 | 11/1996 | Satabakhsh | 310/328 |

*Primary Examiner*—Emanuel Todd Voeltz
*Assistant Examiner*—Hal D. Wachsman
*Attorney, Agent, or Firm*—John B. Sowell ATY

[57] ABSTRACT

A digital programmable ultrasonic generator for driving an ultrasonic transducer includes a computer for receiving and storing a plurality of selectable programs. The programs are indicative of different modes of operation. A profile generator is coupled to the computer to receive programs and to produce a digital reference voltage indicative of a voltage profile to be generated for the mode selected. A digital frequency controller is coupled to a direct digital synthesizer for producing a predetermined frequency in response to a programmed frequency command from the computer. A process controller receives the output of the direct digital synthesizer as a voltage signal having the desired frequency and modifies the voltage depending on the mode of operation and voltage desired before driving a power amplifier coupled to the transducer to be driven.

13 Claims, 5 Drawing Sheets

PROGRAMMABLE DIGITAL FREQUENCY ULTRASONIC GENERATOR

BACKGROUND OF THE INVENTION

1. Field of the Invention

The present invention relates to ultrasonic generators of the type employed to drive ultrasonic transducers. More particularly, the present invention relates to a new and improved ultrasonic generator that is programmable for producing a wide range of resonance frequencies and programmable for automatically following predetermined voltage, current or power profiles during a bonding operation.

2. Description of the Prior Art

Ultrasonic transducers have been employed in the semiconductor industry for over 30 years to impart a scrub motion to a bonding tool in both wire bonders and die bonders during bonding operations. It is well known that both stronger and more predictable wire bonds can be made by imparting ultrasonic motion to the bonding tool during the bonding operation, however, there are no known formulas or series of method steps which will assure a manufacturer that bonds made on fine wire interconnections at first and second bonds are of maximum strength. There are so many variables involved which cannot be measured that it is impossible to predetermine a set of optimum bonding values before starting a bonding operation. For example, the metallurgy and cleanliness of a bonding target or on a semiconductor or frame dramatically affects the bonding parameters. To a lesser extent, the same is true for the bonding wire used to make a fine wire interconnection. If the lead frame or carrier holding a semiconductor device to be bonded is not firmly clamped in a holder, the ultrasonic energy imparted to the bonding wire by the bonding tool is attenuated in the carrier on the holder and not in the wire on the bonding target.

Ultrasonic transducers create a whole series of unsolved problems, not the least of which is that no two ultrasonic transducers made by identical manufacturing procedures have an identical resonance frequency.

This problem can be overcome by testing each transducer to determine its resonance frequency in air while not under load, however, even this factory test does not offer a quick and ready solution because the same ultrasonic transducer when mounted in or on a bonding head of a different bonding machine will shift resonant frequency under load to a different degree. Once the ultrasonic transducer is mounted in or on a bonding machine, the resonance frequencies can be determined as well as the characteristic impedance (Z) in air and under load. These values have been used in K&S U.S. Pat. No. 5,357,423 (assigned to the assignee as the present application) to effect a series of bonding steps that have produced consistent results in bonding fine wires. The aforementioned patent recognizes that control of impedance, current and voltage while bonding produces consistent wire bonds. It was generally believed heretofore that transducers were produced for use at one fixed resonant frequency where the antinode achieved its maximum displacement. For this reason, the clamping mechanism for holding the bonding tool is placed at the antinode and the transducer is driven at its resonant frequency. Only recently have manufacturers of transducers made transducers which have two distinct usable resonant frequencies. Such transducers are shown and described in K&S U.S. Ser. No. 08/349,251 filed 5 Dec. 1994 for a Multi-Resonance Unibody Ultrasonic Transducer, now U.S. Pat. No. 5,578,888.

Prior art transducers for use in wire bonders were designed for one fixed frequency, which is usually the resonant frequency under no load. It is known that the resonant frequency of a transducer shifts under load. K&S U.S. Pat. No. 4,808,948 recognizes this shift in resonance frequency under load and has provided an automatic tuning system that maintain resonant frequency under load. The time required for responding to shifts in resonance frequency have consumed a major portion of the bonding time, thus, have not produced optimum results.

Most of the aforementioned problems are known by those who are responsible for producing commercially available wire bonded semiconductor chips, however, there is no agreement how to solve all of these problems.

The present invention ultrasonic generator overcomes these prior art problems by first characterizing the actual bonding system before starting bonding operations. This characterization of the bonding operation permits the operating personnel to select a mode of operation that will assure desired results. Pre-bonding test are employed to identify the frequency, force, current, voltage or power that produces the best and strongest and fastest bond at both first and second bonds using the generator and transducer which will be used to perform the production operation. Having determined the bonding operation parameters to be used in production by a series of uniform tests, the present invention permits the operator to program the optimum parameters into a host computer of an automatic wire bonder which automatically adjusts the desired control parameters during an actual wire bonding operation.

SUMMARY OF THE INVENTION

It is a principal object of the present invention to provide a highly accurate digital frequency generator having a variable frequency that is programmable.

It is a principal object of the present invention to provide an ultrasonic generator for an ultrasonic transducer that is programmable from a remote computer.

It is a principal object of the present invention to provide a novel direct digital synthesis (DDS) programmable ultrasonic generator capable of being programmed to different current, voltage, power and/or frequency levels during a fine wire bonding operation.

It is a principal object of the present invention to provide a DDS ultrasonic generator which is adaptable to drive a wide range of transducers having different characteristic impedances and resonance frequencies automatically without hardware modification.

It is a principal object of the present invention to provide a frequency resolution accuracy in an ultrasonic generator of several hertz in contrast to prior art generators having several hundreds of hertz accuracy.

It is a principal object of the present invention to provide an ultrasonic generator which automatically tracks desire resonance frequencies.

It is an object of the present invention to provide automatic calibration procedures for start-up or after any change in the bonding system which determines the range of frequencies in which the transducer resonates.

According to these and other objects of the present invention, there is provided a programmable direct digital synthesis (DDS) ultrasonic generator for driving a transducer on an automatic bonding machine. The transducer is programmable for a mode of operation at desired resonance frequencies which change under load condition during a bonding operation. Digital frequencies are controlled automatically and track the shift in resonance frequencies under load while following a predetermined mode of operation adapted to produce optimum results on a device being bonded.

DESCRIPTION OF A PREFERRED EMBODIMENT

Figure 1:
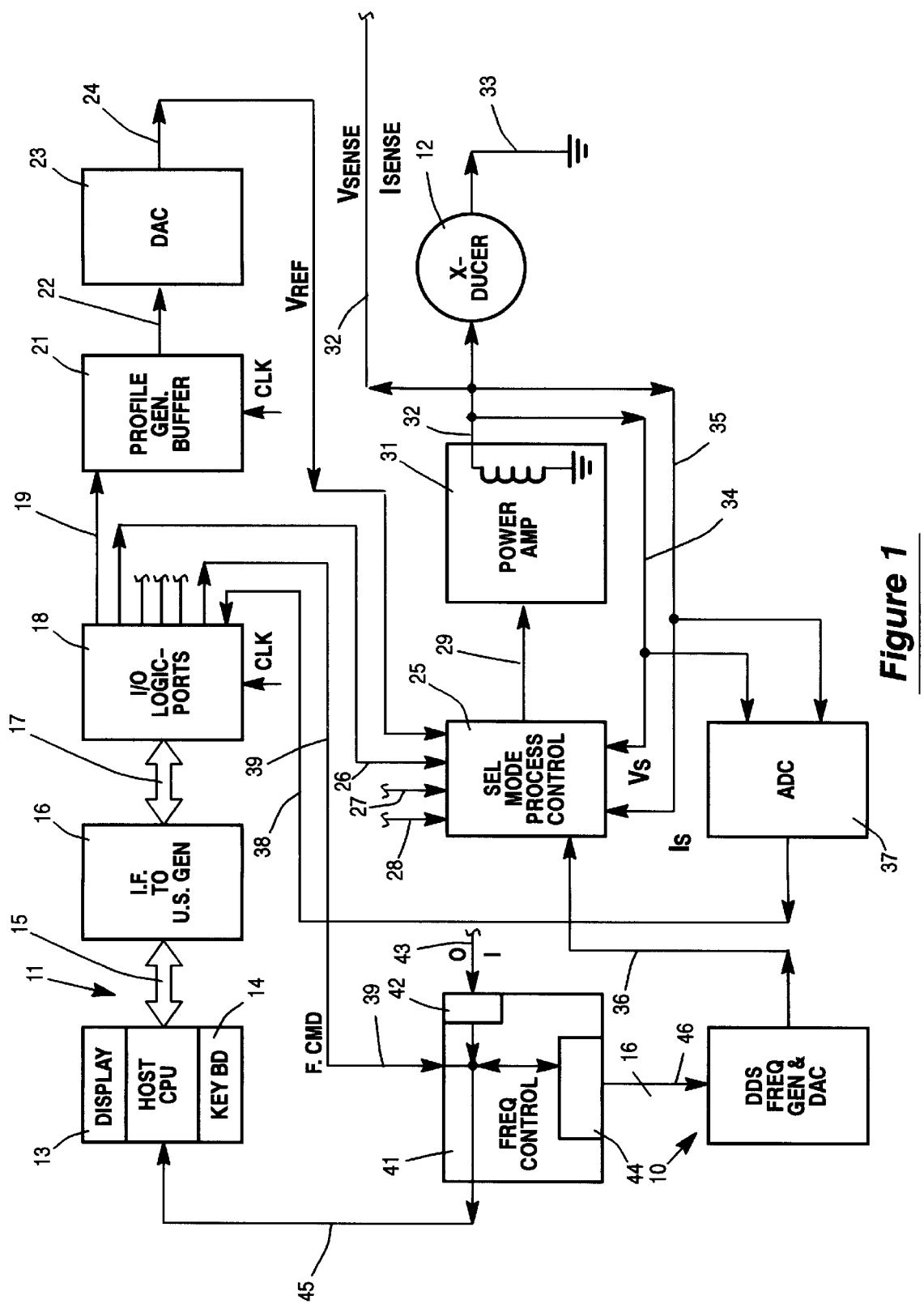
FIG. 1 is a block diagram showing a preferred embodiment programmable digital frequency generator for driving an ultrasonic transducer at predetermined selectable resonant frequencies in different modes of operation.

Refer now to FIG. 1 showing a direct digital synthesis frequency generator 10 which includes a digital to analog converter which is programmed to be run by a host computer 11 to drive a transducer 12. The host computer 11 includes a display 13 and a keyboard 14 used for programming information and setting up the operation of the system shown. The information from the host computer on bus 15 is supplied to an interface 16 of the type which is adapted to accept information from the host computer and supply it on bus 17 to the IO logic ports 18. In the preferred embodiment of the present invention, the host computer 11 is capable of supplying a program or profile via components 15 to 18 to line 19 and storing the information in a profile generator 21 which may be clocked out on line 22 to a digital to analog converter 23. The profile information on output line 24 from DAC 23 is coupled to the process controller 25. In addition to the information on line 24, there is shown dedicated mode selection lines 26, 27 and 28 from ports in the IO logic 18. Commands from CPU 11 pass through the ports of the logic 18. The process controller with additional command or mode information is capable of generating a voltage signal on line 29 that will define the profile generated by the information in profile generator 21. This information enables the power amplifier 31 to track a desired level of current, voltage or power. The ultrasonic transducer 12 is provided with ground connection shown as line 33. As will be explained in greater detail hereinafter, information on line 32 will be used to generate a voltage sense signal and a current sense signal on lines 34 and 35. Voltage and current sense lines are coupled to the process control 25 as feedback signals. In addition to the feedback signals on lines 34 and 35, an analog frequency signal on line 36 is supplied from the frequency generator 10. Thus, the process controller has sufficient information to generate a voltage, current or power profile as will be explained.

There is further shown an analog to digital converter 37 coupled to the voltage and current sense lines 34 and 35 and having an output on line 38 which is coupled into one of the IO logic ports 18 for supplying calibration information back to the Host CPU 11.

The host computer 11 generates command information which enters the system shown through the IO logic ports 18. Line 39 from the IO logic ports is used to transmit frequency commands to the frequency controller 41. The actual frequency to be generated by generator 10 is set in the up and down counter 42 previous to control by information on line 43. Signals on line 43 will vary the frequency established by the Host computer 11. The frequency controller 41 and the contents of registers 42 and 44 may be monitored by CPU 11. Having explained briefly that the CPU 11 generates commands which define a frequency for the digital frequency controller 41, the buffer register 44 contains the bits which control the DDS and the frequency of generator 10.

The host computer not only can set the frequency controller 41 but is capable of generating a profile of information in profile generator 21 which determines both the time and magnitude of points on the profile presented on line 22 to DAC 23 as will now be explained.

Figure 2:
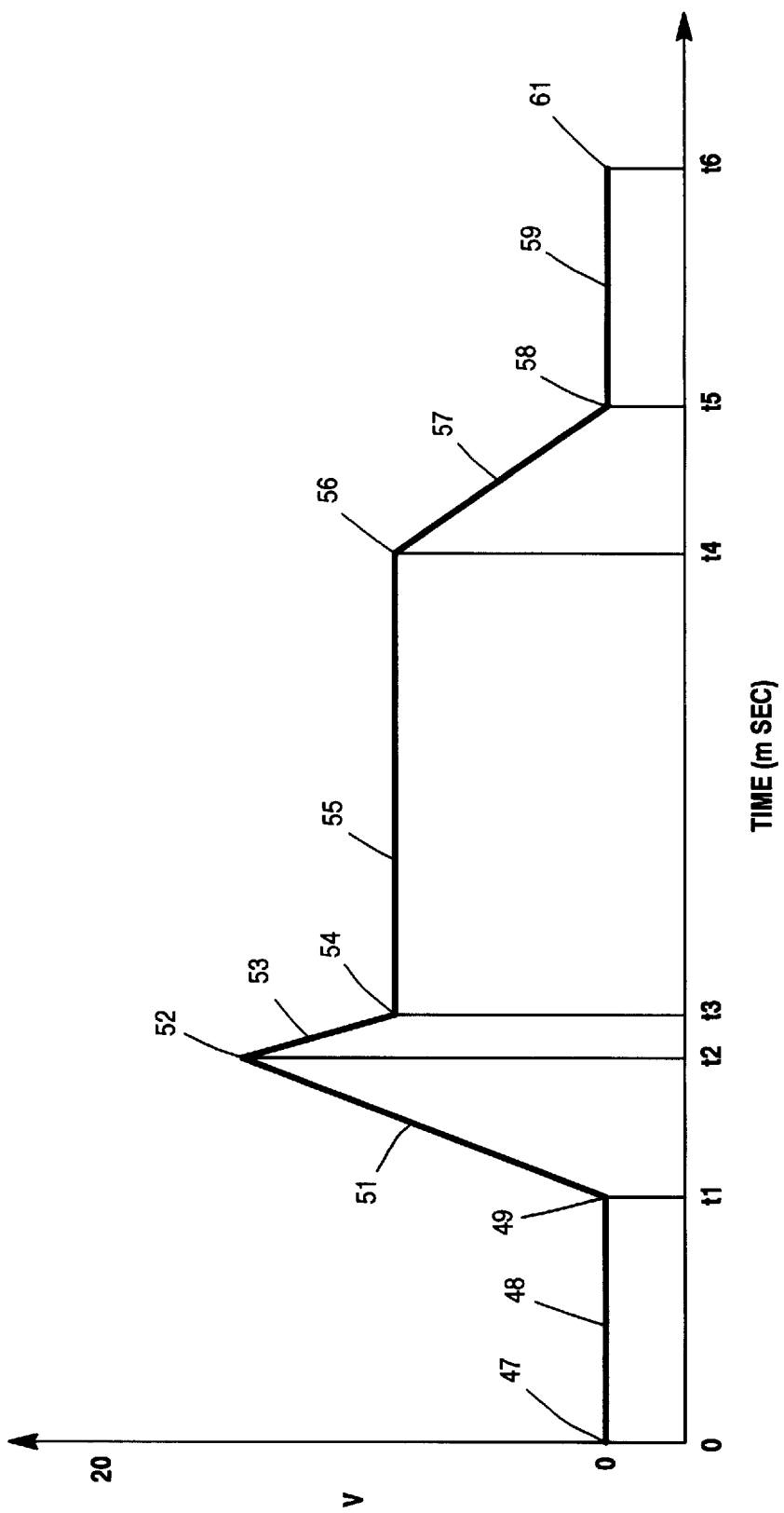
FIG. 2 is a voltage versus time profile of the type which is programmable by an operator at a host computer for controlling power or current or voltage of the present novel ultrasonic generator.

Refer now to FIG. 2 showing a voltage versus time profile of the type which is programmable by an operator at the host computer 11 to control either the voltage, current or power on the transducer holding the bonding tool. Points 47 and 48 are prior to touch down at the bond point 49. The bond delay ends at point 49 shown at T1. The ultrasonic generator is powered up between times T1 and T2 shown as line 51. The maximum voltage applied is the voltage being generated at line 22 to DAC 23 and is not the exact same as the voltage on line 29 to the power amplifier 31. After reaching maximum voltage at point 52 and T2, the voltage is lowered as shown along transition line 53 after overcoming any friction or oxidation at the bond point. The desired voltage for bonding is reached at point 54 and is continued along the time line 55 until time T4 and point 56. At this point, the bonding operation is complete and the voltage is reduced along the transition line 57 from 56 to point 58 between times T4 and T5. At point 58 the voltage could be eliminated during some types of bonding operations but may be used to stabilize the bonding tool before starting another bond at point 61 or ending the bonding operation.

Having explained a typical voltage profile for controlling voltage, it will be appreciated that a different voltage profile will be used for constant voltage or for constant current or constant power. The voltage reference on line 24 is an analog signal which is applied to the process controller 25 and is again modified to produce analog voltage signal on line 29 to drive the power amplifier 31 which supplies the power to the transducer 12. Having explained briefly FIG. 1 and the desirability of changing the voltage, power or current during an actual bonding operation, it will be appreciated that the profile waveform shown in FIG. 2 may apply to voltage, current or power which is designed and determined during a setup and test operation. For example, if the first and second bonds are being made on highly oxidized or dirty pads, it is desirable to generate a spike or ramp up as shown at line 51 to clean the target to be bonded prior to the actual bonding operation and then after proceeding down to point 54. The level 55 may represent constant voltage, constant current or constant power.

Figure 3:
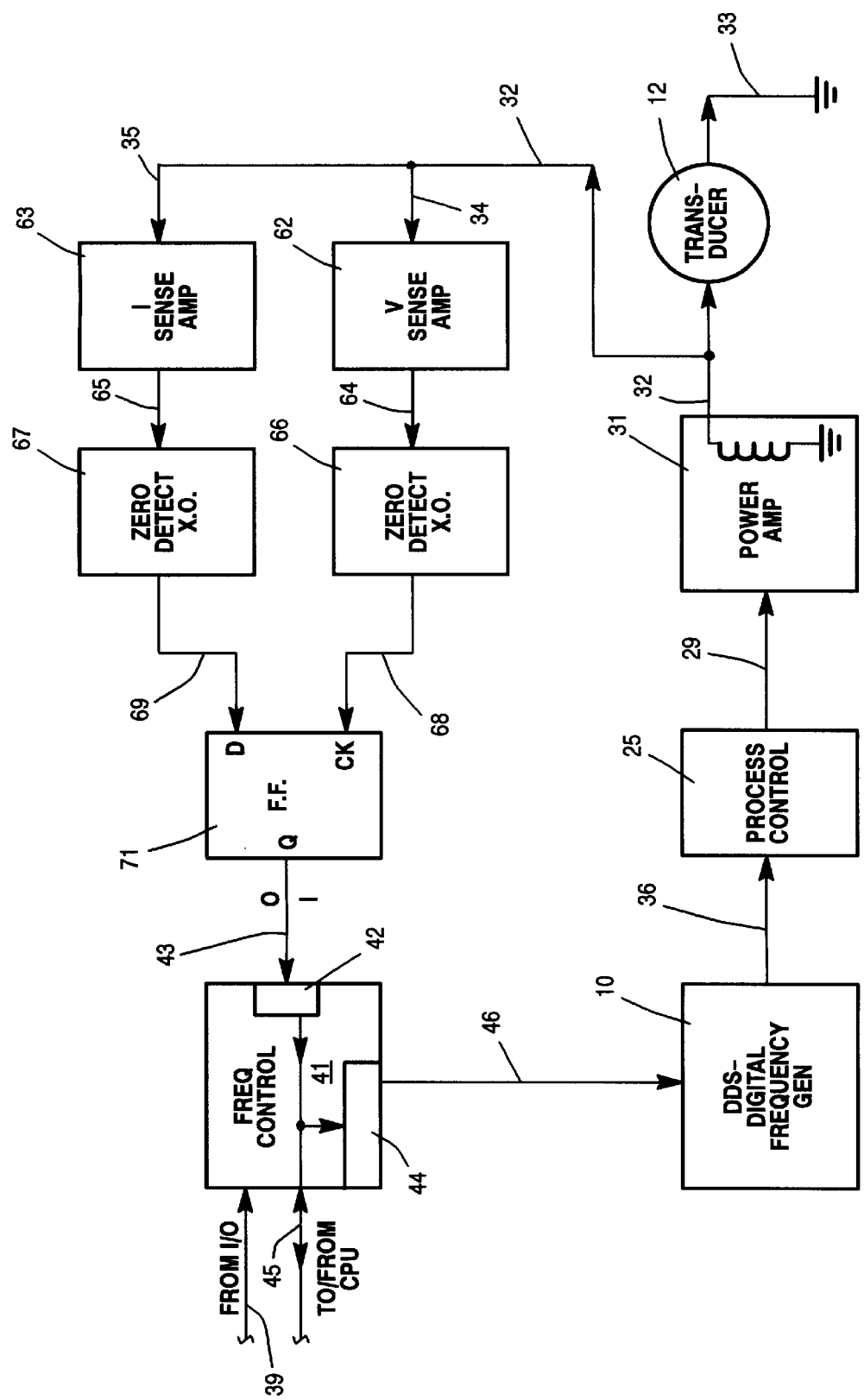
FIG. 3 is a more detailed block diagram showing the phase detector and frequency control loop for the digital frequency generator of FIG. 1.

Refer now to FIG. 3 showing a more detailed block diagram of the phase detector and frequency control loop for the digital frequency generator 10 shown in FIG. 1. The frequency controller 41 is identical to the frequency controller shown in FIG. 1 and the same numerals are used thereon and operate in the same manner. The frequency controller is shown having an input line 43 on which either a 0 or a 1 is applied to the up-down counter 42. In order to produce this signal, the voltage and current on line 32 at the output of the power amplifier is sensed. The line 32 is split and applied to a voltage sense amplifier 62 and a current sense amplifier 63. The output signals on line 64 and 65 are applied to a pair of zero crossover detectors 66 and 67 for the voltage and current lines respectively. The zero crossover detector 67 is connected to the data or D input of flipflop 71 and the reset or clock input is connected to the zero crossover detector 66 so that the output of the flipflop 71 at the Q output is either a high or a low signal indicative of a 0 or 1 which drives the up-down counter 42 faster or slower depending on whether the signal is high or low and adds or subtracts a bit from the up-down counter 42. The count in the up-down counter is transferred to the buffer 44 which generates a digital signal indicative of the desired frequency. The desired frequency on line 46 is a 16 bit signal which is applied to the direct digital synthesis frequency generator 10 which produces an analog frequency signal at its output line 36. The analog signal on line 36 is processed in the process controller 25 as mentioned hereinbefore to produce a desired analog signal on output line 29 that is applied to the power amplifier 31 to produce the signal on line 32 which is sensed as either current or voltage being applied to the transducer 12.

Figure 4:
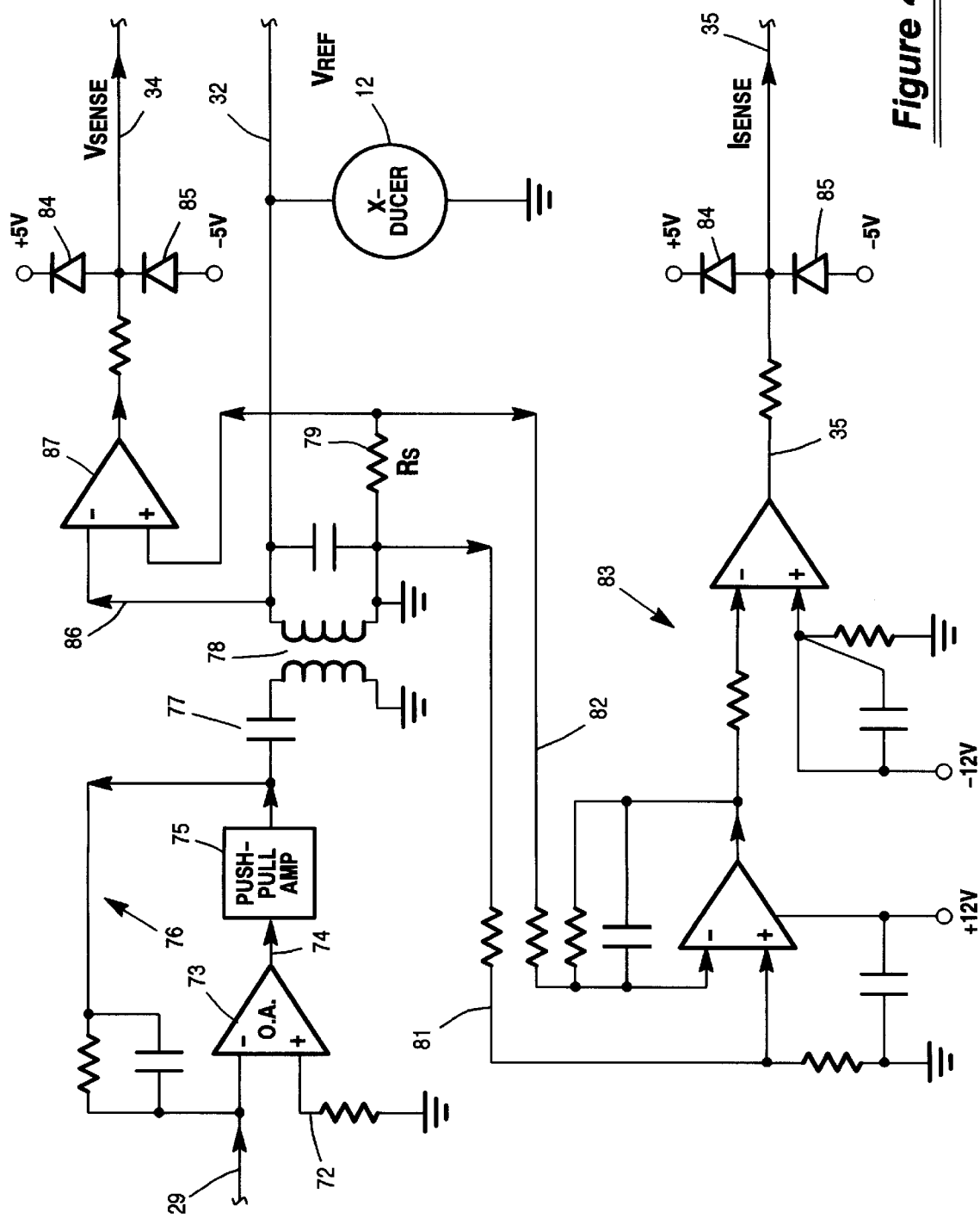
FIG. 4 is a more detailed block diagram showing a preferred power amplifier for generating feedback and sense signals used as inputs in FIGS. 1 and 3.

Refer now to FIG. 4 showing in more detail a block diagram of a preferred embodiment power amplifier for generating the voltage signal on line 29 from the process controller 25 shown in FIG. 3. The signal on line 29 is representative of a voltage level which is desired but is yet to be power amplified. The signal is applied to an operational amplifier 73 which is tied to ground through reference line 72. The output of the operational amplifier 73 is applied to a Class A push-pull amplifier 75 which is connected in the feedback loop 76 and returns to the negative input at line 29 of the amplifier 73. The output of the Class A push-pull amplifier 75 on line 76 is applied to an AC coupling capacitor 77 which is applied through the primary coil of a step-up transformer 78 having a secondary coil which connects to the output of the power amplifier on line 32 and also is connected through a sensing resistor 79. The output across the sensing resistor 79 on lines 81 and 82 is applied in a conventional manner to a conventional two-stage amplifier 83 to produce the aforementioned current sense signal on line 35. The signal on line 35 is protected and contained between the boundaries of +5 voltage and −5 volts by the protection diode 84 and 85.

The voltage output from the secondary of the step-up transformer 78 on line 86 is coupled to a voltage sense amplifier 87 having an output on line 34. The signal on line 34 is protected and held by the protection diodes 84 and 85 between the voltage swings of +5 and −5 volts.

Figure 5:
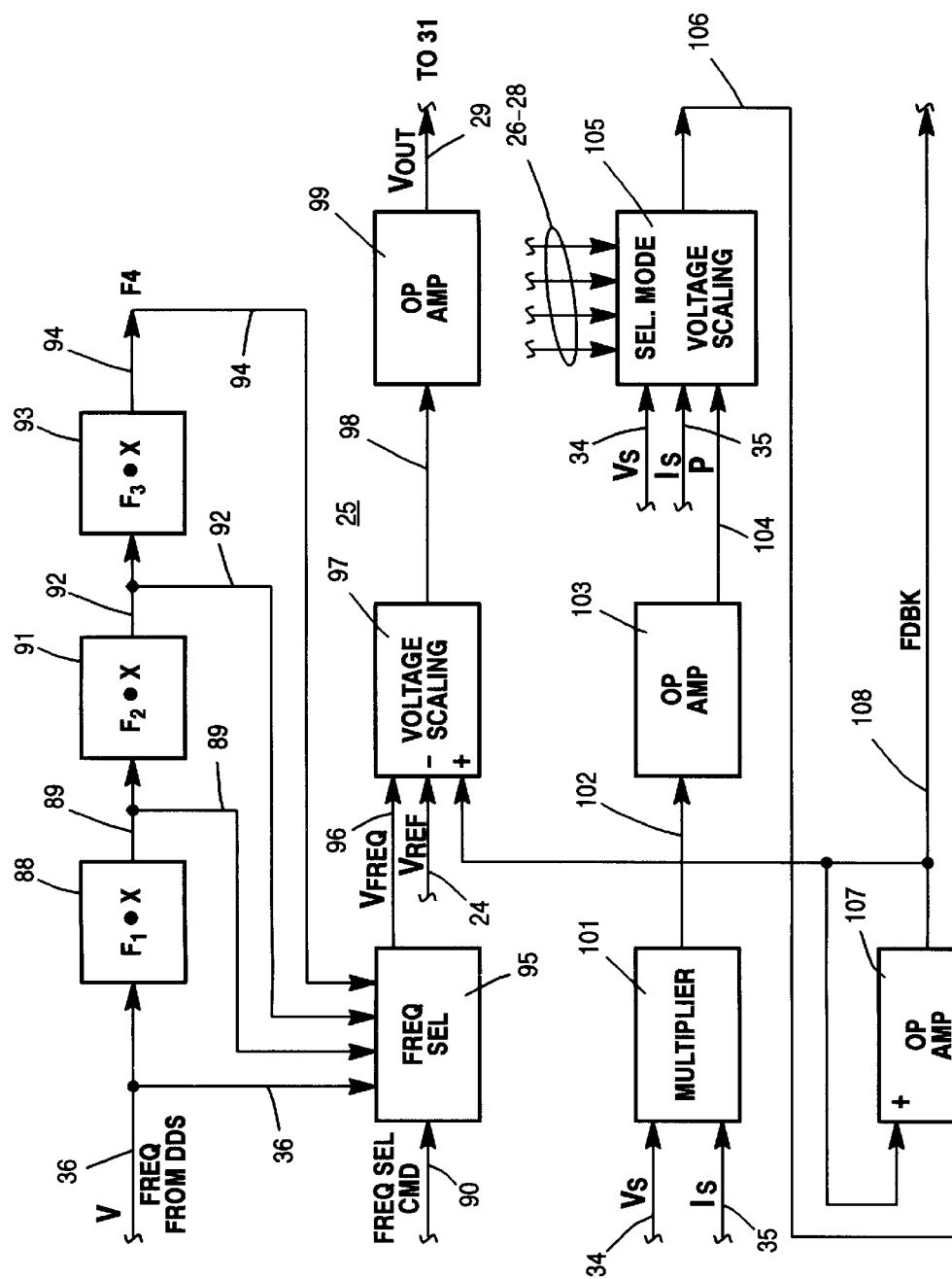
FIG. 5 is a more detailed block diagram of a preferred process controller used to maintain a desired profile voltage of a ultrasonic generator during a bonding operation.

Refer now to FIG. 5 is showing a more detailed block diagram of the process controller 25 used to maintain a desired profile voltage during a bonding operation. The aforementioned signal on line 36 from the DDS 10 is shown being applied to a first stage frequency multiplier 88 which produces a multiplied frequency on output line 89. The signal on line 89 is applied to a second frequency multiplier 91 having an output on line 92. The signal on line 92 is applied to a third frequency multiplier 93 having an output shown on line 94. It will be understood that in the simplest form of frequency multiplier, the frequency multipliers are frequency doublers. Thus by adding additional frequency multipliers the range of the frequency on line 36 may be extended to any usable frequency. In the preferred embodiment of the present invention, the lowest frequency on line 36 to be employed in a transducer is approximately 20 kilohertz which may be expanded out beyond 800 kilohertz. Further, by adjusting the frequency on line 36 any desirable frequency may be obtained as an input to the frequency selector 95. The frequency selector 95 selects one of the frequencies on the input lines and produces an output voltage signal frequency on line 96 which is applied to a voltage scaling circuit 97 shown having two additional inputs to be explained later. The output from the voltage scaling circuit 97 on line 98 is applied to operational amplifier 99 for producing the voltage output signal on line 29 which is applied to the power amplifier 31. The signals on lines 26 to 28 are command signals which permit the frequency selector 95 to select one of the frequency lines 36, 89, 92, 94.

Refer now to voltage sensing line 34 and current sensing line 35 shown being applied to a multiplier 101 which produces a power output signal on line 102. The power output signal on line 102 is applied to an operational amplifier 103 to produce an amplified power signal on line 104 that is applied to a voltage scaling circuit 105. The voltage scaling circuit 105 is shown having voltage sensing and current sensing signals as inputs as well as the aforementioned mode select signals on lines 26 to 28. The output of voltage scaling circuit 105 on line 106 is a voltage signal which is applied to the negative input of amplifier 107 shown having a feedback signal from the output of operational amplifier 107 on line 108 connected to the positive input of the operational amplifier 107. The signal on line 108 is also applied as a positive input signals to the aforementioned scaling circuit 97 which produces the output signal on line 98.

Having explained a preferred embodiment frequency generator, it will now be understood that the signal on line 96 may be generated at any usable frequency as a frequency signal and that the voltage reference signal on line 24 from the output of the profile generator may also be applied to the voltage scaling circuit 97 to produce a desired profile voltage signal on line 98. The signal on line 98 may be a constant current, a constant voltage or a constant power signal or even a variable signal to produce a desired result by generating a profile of the type explained with reference to FIG. 2.

Having explained a preferred embodiment of the present invention which permits a computer to control a frequency of a bonding operation during a bonding operation, it will be appreciated that it is now possible to control an ultrasonic transducer to product optimum bonding strength of the first or second bond by changing the frequency of the generator in under ten microseconds.

What is claimed is:

1. Apparatus for driving ultrasonic transducers at different resonance frequencies, comprising:

computer means for determining a desired resonance frequency of an ultrasonic transducer, digital frequency control means coupled to said computer means for setting digital frequencies in response to instructions from said computer means, digital frequency generator means coupled to said digital frequency control means for producing frequency signals in response to said frequency control means, power amplifier means coupled to said ultrasonic transducer and said digital frequency generator means, analog to digital sensing means coupled to the output of said power amplifier, means coupling the output of said analog to digital sensing means to said computer means and to said digital frequency control means, and program means in said computer means for varying the frequency of said digital frequency generator while monitoring the voltage output of said power amplifier to determine the desired resonance frequency of said ultrasonic transducer.

2. Apparatus as set forth in claim 1 wherein said program means in said computer means is programmed to determine a plurality of desired resonant frequencies under load condition.

3. Apparatus as set forth in claim 2 wherein said program means and said computer means is programmed to determine a first primary resonant frequency at first bond load conditions and a second primary resonant frequency at a second bond load condition.

4. Apparatus as set forth in claim 3 wherein said computer means comprises means for generating command signals during a bonding operation indicative of said first and second primary resonant frequencies at said first and second bond during bonding operations.

5. Apparatus for driving ultrasonic transducers at predetermined resonance frequencies, comprising:

computer means programmed to include the approximate values of resonant frequencies to be maintained during a bonding operation, said computer means further including memory means containing a mode of operation to be maintained during a bonding operation, profile generation means coupled to said computer means for generating digital values of voltage to be maintained to effect one of a plurality of modes of operation, frequency control means coupled to said computer means for generating digital values indicative of said approximate values of resonant frequencies to be generated, digital frequency generator means coupled to said frequency control means for generating signals indicative of said approximate values of resonant frequencies, power amplifier means coupled to receive the signals indicative of the approximate values of resonant frequencies and for generating a power signal for driving said ultrasonic transducer, means for sensing the phase of the current and voltage of said power signal, and means responsive to sensing the phase difference between the voltage and the current and for generating an output signal coupled to said frequency control means for immediately adjusting said approximate resonant frequencies to an accurate resonant frequency.

6. Apparatus as set forth in claim 5 wherein said frequency generation means comprises a direct digital synthesis frequency generator having a frequency range of under 1,000 hertz to over 500 kilohertz.

7. Apparatus as set forth in claim 6 wherein said computer means is programmable up to approximately 500 kilohertz.

8. Apparatus as set forth in claim 5 wherein the response time for adjusting a change in frequency is under 10 microseconds.

9. Apparatus as set forth in claim 5 which further includes a mode selector responsive to mode commands generated by said computer means for modifying the output of said profile generation means.

10. Apparatus as set forth in claim 9 wherein said mode selector comprises means for selecting a constant voltage or a constant current mode.

11. A method of controlling the frequency of an ultrasonic frequency generator, comprising the steps of:

generating a digital frequency command in a Host computer, converting said digital frequency command to digital frequency values, applying said digital frequency values to a direct digital synthesizer to generate an analog frequency signal output, scaling said analog frequency signal output in a first scaling circuit, applying said scaled analog frequency signal output to a voltage amplifier to provide a transducer driving signal, applying said transducer driving signal to an ultrasonic transducer, sensing the difference in phase between the voltage and current being applied to said transducer driving signal, and adjusting the digital frequency values to said direct digital synthesizer to provide a resonant frequency of said ultrasonic transducer.

12. A method as set forth in claim 11 which further includes the step of varying the magnitude of the scaled analog frequency signal output according to a predetermined mode of operation.

13. A method as set forth in claim 12 which further includes the steps of applying a plurality of selectable mode signals to a second voltage scaling circuit, selecting one of said plurality of modes, generating a feedback signal indicative of the selected mode, and applying the feedback signal from said second scaling circuit to said first scaling circuit to adjust the voltage to said voltage amplifier.

* * * * *